United States Patent
Iwase et al.

(10) Patent No.: US 6,562,200 B2
(45) Date of Patent: May 13, 2003

(54) THIN-FILM FORMATION SYSTEM AND THIN-FILM FORMATION PROCESS

(75) Inventors: Hideo Iwase, Kanagawa (JP); Makoto Kameyama, Chiba (JP); Koji Kitani, Tokyo (JP); Yoichi Hoshi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/933,670

(22) Filed: Aug. 22, 2001

(65) Prior Publication Data

US 2002/0023831 A1 Feb. 28, 2002

(30) Foreign Application Priority Data

Aug. 29, 2000 (JP) ........................................ 2000-258617

(51) Int. Cl.⁷ .............................................. C23C 14/34
(52) U.S. Cl. ............................ 204/192.12; 204/298.06; 204/298.07; 204/298.11; 204/298.14
(58) Field of Search ........................ 204/298.06, 298.07, 204/298.11, 298.14, 192.12

(56) References Cited

U.S. PATENT DOCUMENTS

| | | | | |
|---|---|---|---|---|
| 3,562,142 A | * | 2/1971 | Lamont, Jr. ............ | 204/298.06 |
| 5,328,583 A | | 7/1994 | Kameyama et al. ... | 204/192.12 |
| 5,393,398 A | * | 2/1995 | Sugano .................. | 204/298.11 |
| 5,415,753 A | * | 5/1995 | Hurwitt et al. ........ | 204/192.12 |
| 5,529,670 A | * | 6/1996 | Ryan et al. ............ | 204/192.15 |
| 5,582,879 A | | 12/1996 | Fujimura et al. ........... | 427/561 |
| 5,593,551 A | * | 1/1997 | Lai ........................ | 204/192.12 |
| 5,858,450 A | | 1/1999 | Fujimura et al. ............... | 427/9 |
| 5,980,702 A | * | 11/1999 | Parker ................... | 204/192.12 |

FOREIGN PATENT DOCUMENTS

| | | | |
|---|---|---|---|
| EP | 0860514 | * | 8/1998 |
| JP | 6-192829 | | 7/1994 |

OTHER PUBLICATIONS

John A. Thornton "Influence of apparatus geometry and deposition conditions on the structure and topography of thick sputtered cotatings", J. Vac. Sci. Technology, vol. 11, No. 4 (Jul./Aug., 1974), pp. 666–670.

Witold M. Posadowski, et al. "Sustained self–sputtering using a direct current magnetron source", J. Vac. Sci. Technology., vol. 11, No. 6 (Nov./Dec. 1993), pp. 2980–2984.

Shinku—Journal of The Vacuum Society of Japan, vol. 35, No. 2 (1992), pp. 20–25.

Y. Hoshi et al. "Control of crystal orientation of Ti thin films by sputtering", Electrochmica Acta. 44 (1999), pp. 3495–3952.

\* cited by examiner

*Primary Examiner*—Rodney G. McDonald
(74) *Attorney, Agent, or Firm*—Fitzpatrick, Cella, Harper & Scinto

(57) ABSTRACT

In a thin-film formation process and system, a target and a substrate are placed in a sputtering space and a film-forming space, respectively, the pressure in the film-forming space is maintained at a pressure lower than the pressure in the sputtering space and a pressure sufficient for sputtered particles to move in the film-forming space with their mean free path which is longer than the distance between the grid plate and the substrate, and the target is sputtered to form a thin film on the substrate.

22 Claims, 9 Drawing Sheets

THIN-FILM FORMATION SYSTEM AND THIN-FILM FORMATION PROCESS

BACKGROUND OF THE INVENTION

1. Field of the Invention

This invention relates to a thin-film formation system and a thin-film formation process. More particularly, this invention relates to a thin-film formation system having a chamber consisting basically of a sputtering space and a film-forming space and a grid plate disposed between the sputtering space and the film-forming space, and a thin-film formation process making use of this system.

2. Related Background Art

Sputtering, which is one of thin-film formation processes, is a thin-film formation process in which positive ion particles generated by glow discharge are made incident on a film material to which a negative potential is kept applied, called a target, and a film material which have been released to the vacuum, called sputtered particles, are deposited on a substrate by the phenomenon of sputtering.

The sputtering, compared with vapor deposition, can form films having superior characteristics because the sputtered particles have a higher kinetic energy. It also has a characteristic feature that the system can be of simple construction and has a superior process reproducibility even in comparison with other processes in which a high energy is used to make material particles incident on substrates, such as ion plating. For these reasons, it is one of film formation processes most frequently used at present in the industrial production of thin films, e.g., in film coating of glass and film formation processes for semiconductor devices.

Conventional sputtering, however, utilizes glow discharge generated between the cathode target and the anode chamber, and hence the inside of a vacuum chamber has had to be filled with a rare gas of hundreds of mPa in pressure, called sputtering gas.

FIG. 1 illustrates the construction of a conventional thin-film formation system which carries out common sputtering. A vacuum chamber 2 shown here is provided therein with a target 3 and a substrate 8 on which a film is to be formed which are so disposed as to face each other substantially in parallel. The target 3 is fastened to a cathode member for magnetron sputtering. This cathode member has a backing plate 4 to which the target is fastened and a negative voltage is applied from a DC power source, a plurality of magnets which generate a magnetic field in the plane substantially parallel to the target 3, a shield plate 5 which protects members other than the target 3 from the phenomenon of sputtering, and a cooling-water circulator 10 for cooling the target 3.

A vacuum pump 1 is attached to the vacuum chamber 2. To the vacuum chamber 2, argon gas is introduced through a flow controller 9. Reference numeral 11 denotes argon molecules and 12, sputtered particles.

As can be seen from this drawing, the substrate 8 and target 3 which are disposed in the vacuum chamber 2 are always exposed to sputtering gas in the course of film formation.

Meanwhile, J. Vac. Sci, Technol., Vol. 11, No. 4, July/August 1974, pp. 666–670 refers briefly to the relationship between film characteristics and sputtering gas in the above conventional thin-film formation system. This paper explains that, with an increase in the pressure of sputtering gas, films come to have many pores (voids) and have columnar structure. The films having many voids and having columnar structure are physically weak and also chemically unstable, and hence are unfit for industrial use in many cases.

Electrochimica Acta 44 (1999), pp. 3945–3952, also reports the relationship between the pressure of sputtering gas, the incident angle θ of sputtered particles on substrate and the kinetic energy of sputtered particles. This paper explains that, when the sputtering gas is at a high pressure, the sputtered particles have a low kinetic energy and falls on the substrate at a large incident angle θ.

In general, film material particles having a low kinetic energy move on the substrate surface at a short distance after their collision against it, and have a low possibility of becoming stable at optimum positions of the film surface. Also, with an increase in particles falling at a large incident angle θ and incident obliquely on the substrate, films come to have many voids or pores because of the shadowing effect ascribable to the unevenness of substrate surface.

As stated above, when the sputtering gas is at a high pressure, the sputtered particles released from the target are scattered by the sputtering gas before they reach the substrate, and fall on the substrate at a large incident angle θ, so that the film material particles lose their kinetic energy correspondingly to cause deterioration of film quality inevitably.

To solve such problems, it has been considered necessary to develop a method of lowering the pressure of sputtering gas in the course of film formation or removing the scattering effect of sputtered particles that is caused by sputtering gas.

Sputtering which can be carried out at a low pressure includes, e.g., a low-voltage sputtering process disclosed in Shinku, Vol. 35, No. 2 (1992), pp. 70–75, and a self-sputtering process disclosed in J. Vac., Sci. Technol. A11(6), November/December (1993), pp. 2980–2984.

The low-voltage sputtering is a process in which the potential applied to the target and the magnetic-field intensity at the target surface are made higher to make the density of plasma higher so that the glow discharge can be continued even at a low pressure. The self-sputtering is a process in which the plasma is formed using film material particles in place of sputtering gas, and is a process by which the plasma can be formed without feeding any sputtering gas into the vacuum chamber.

These two processes, however, involve problems in practical use such that the both can make glow discharge stable with difficulty, have a low film formation rate, and, compared with conventional sputtering, afford no free selection of film materials.

Japanese Patent Application Laid-Open No. 6-192829 also discloses a process in which a sputtering chamber and a film-forming chamber are separately set up and the sputtered particles are drawn into the film-forming chamber through holes which connect the sputtering chamber and the film-forming chamber. This process enables the pressure in the film-forming chamber to be set lower than the sputtering chamber, and hence can keep the film material particles from scattering in the film-forming chamber. However, the inside of the sputtering chamber is filled with sputtering gas kept at substantially the same pressure as in the case of conventional sputtering, and film material particles scattered in the sputtering chamber reach the substrate with no rectification. Thus, this is not a process by which the sputtered particles can be kept from scattering so that their incident angles on the substrate can be made perfectly uniform.

Collimation is available as a sputtering process taking note only of the rectification of sputtered particles, which is carried out without lowering the pressure of sputtering gas. The collimation is a process in which a collimator is provided between a substrate and a target to control the incident angles of sputtered particles on the substrate. This process, however, has a possibility that the particles having passed the collimator are unwantedly scattered by the sputtering gas before they reach the substrate.

As discussed above, any conventional sputtering can not completely remove the influence of the scattering of sputtered particles that is caused by sputtering gas, and it has been difficult to produce dense and high-quality thin films having a good bottom coverage.

SUMMARY OF THE INVENTION

An object of the present invention is to solve the above problems the prior art has had, and provide a process and a system which are able to form dense and high-quality thin films having a good bottom coverage.

To achieve the above object, the present invention provides a process for forming a thin film by means of a sputtering apparatus having a chamber comprising a sputtering space and a film-forming space and a grid plate disposed between the sputtering space and the film-forming space, comprising the steps of:

placing a target and a substrate in the sputtering space and the film-forming space, respectively;

maintaining the pressure in the film-forming space at a pressure lower than the pressure in the sputtering space and a pressure sufficient for sputtered particles to move in the film-forming space with their mean free path which is longer than the distance between the grid plate and the substrate; and sputtering the target to form a thin film on the substrate.

The present invention also provides a thin-film formation system comprising:

a chamber comprising a sputtering space for placing a target therein and a film-forming space for placing therein a substrate on which a thin film is to be formed;

a grid plate disposed between the sputtering space and the film-forming space; and a pressure control means for maintaining the pressure in the film-forming space at a pressure lower than the pressure in the sputtering space and a pressure sufficient for sputtered particles to move in the film-forming space with their mean free path which is longer than the distance between the grid plate and the substrate.

DESCRIPTION OF THE PREFERRED EMBODIMENTS

Figure 1:
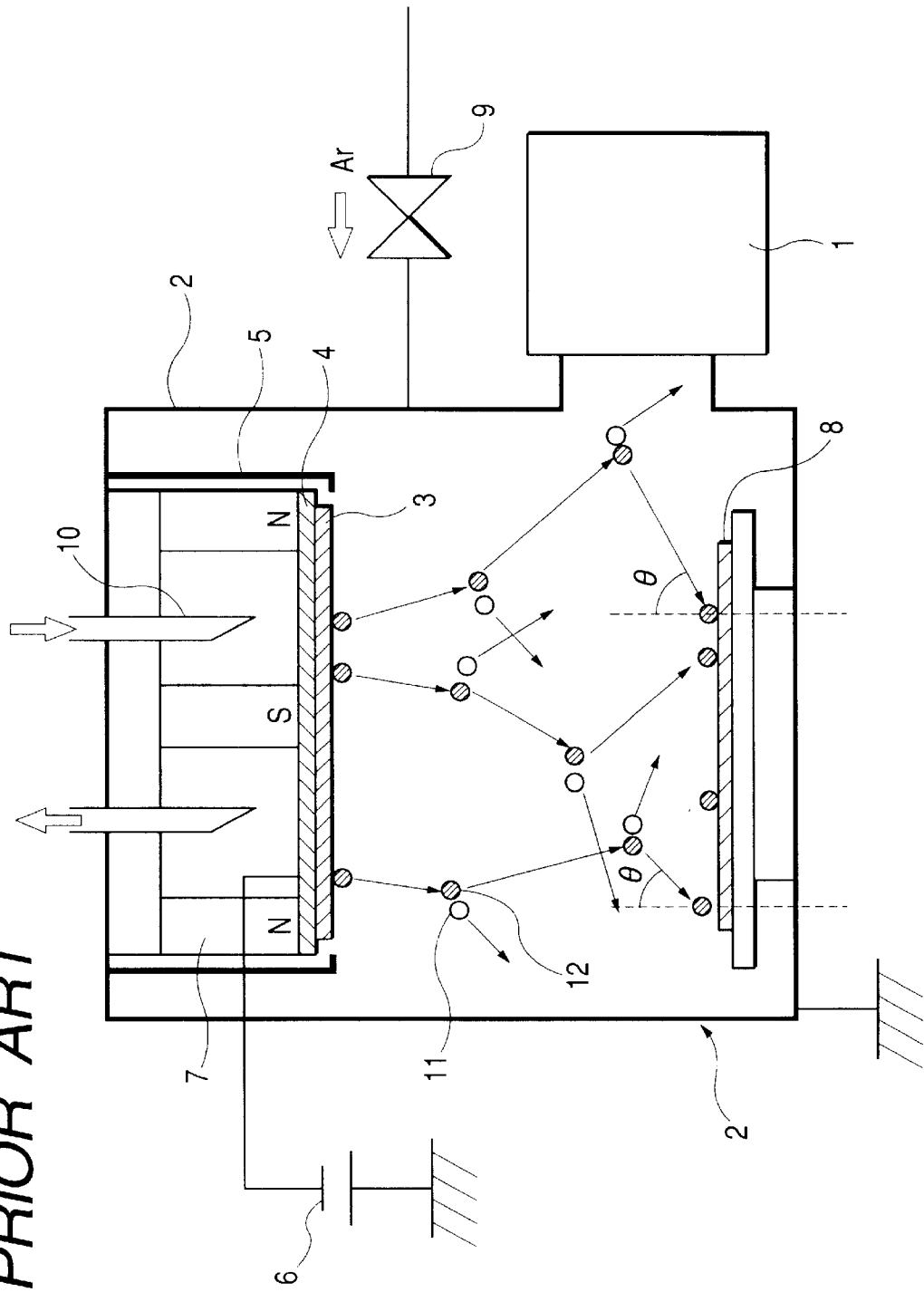
FIG. 1 illustrates the construction of a conventional thin-film formation system.

In the present invention, sputtering is carried out in a vacuum chamber consisting basically of a sputtering space and a film-forming space. A grid (grid plate) is disposed between the sputtering space and the film-forming space, and the pressure in the film-forming space is maintained at a pressure lower than the pressure in the sputtering space and a pressure sufficient for sputtered particles to move in the film-forming space with their mean free path which is longer than the distance between the grid plate and the substrate.

The "mean free path" referred to in the present invention is meant to be the average distance that extends until any moving particles collide against other particles. In general, mean free path in gases containing two components A and B depends on the molecular numerical density and molecular radius of each gas. However, since the molecular numerical density of sputtering gases is sufficiently larger than the molecular numerical density of sputtered particles and the sputtered particles are usually single atoms like the sputtering gas, its molecular radius does not differ greatly from that of the sputtering. Hence, under such conditions, mean free path $\lambda$ can be expressed as $$\lambda = 3.1 \times 10^{-24} \times T/(\sigma^2 P)$$

where the pressure of sputtering gas is represented by P (Pa), diameter by $\sigma$ (m), and temperature by T (K).

In common sputtering, the inside of a vacuum chamber must be filled with sputtering gas of 0.1 to 1 Pa. For example, assuming that argon gas having a pressure of 0.4 Pa and a temperature of 25° C. is used, the mean free path $\lambda$ is 1.8 cm. The inside of the sputtering space is kept in such a state in order to carry out the sputtering. To cause glow discharge to take place, the distance between the target and the grid must be kept at 1 cm or more at least. Assuming that the distance between the target and the grid is 1.8 cm, the sputtered particles collide against the sputtering gas about one time on the average until they pass the grid.

When, however, the pressure in the film-forming space is lower than the pressure in the sputtering space, e.g., when the pressure in the film-forming space is 0.04 Pa, the mean free path $\lambda$ is 18 cm, where, assuming that the distance between the grid and the substrate is 4 cm, the sputtered particles collide against the sputtering gas about 0.22 time. The number of times of collision of about 0.22 time on the average is the number of time that is almost negligible for the formation of films.

Under such a situation, sputtered particles having passed the grid and having been rectified fall on the substrate surface at the same incident angle without being scattered by the sputtering gas, as long as only particles having a velocity in a certain direction can be led by the grid to the film-forming space. Hence, this enables formation of dense and high-quality thin films having a good bottom coverage.

In addition, in the present invention, the quantity of electrically positive or negative particles to be incident on the substrate can be controlled in accordance with the potential of the grid or that of a network electrode.

Embodiments of the present invention are described below with reference to the accompanying drawings.

(Embodiment 1)

Figure 2:
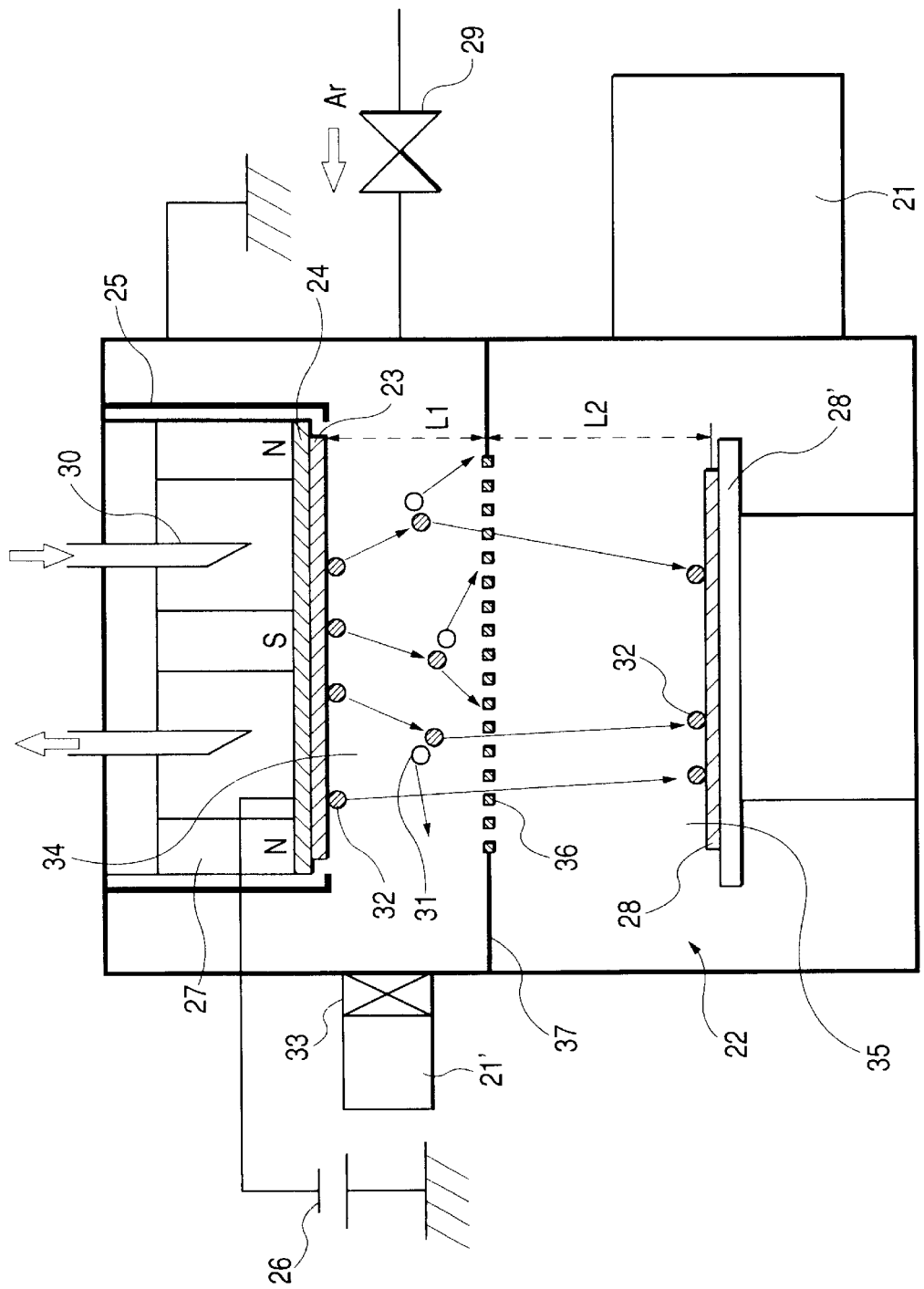
FIG. 2 is a schematic view showing a first embodiment of the thin-film formation system according to the present invention.

FIG. 2 is a schematic view showing a first embodiment of the thin-film formation system according to the present invention. In FIG. 2, reference numeral 21 denotes a vacuum pump serving as an evacuation means; 22, a vacuum chamber; 23, a target; 24, a backing plate; 25, a shield plate; 26, a sputtering power source for causing glow discharge; 27, a magnet; 28, a substrate; 28', a substrate holder; 29, a flow controller provided in a gas feed system; 30, a cooling-water circulator as a cooling means for cooling the target 23; 31, argon molecules; and 32, sputtered particles.

The interior of the vacuum chamber 22 is partitioned into a sputtering space 34 in which the target 23 has been placed and a film-forming space 35 in which the substrate 28 has been placed for forming a film thereon, which is partitioned with a grid plate 36 and a partition wall 37; the former having a plurality of openings 38 with an aspect ratio of 1 or higher.

The sputtering space 34 communicates with a vacuum pump 21' serving as a second evacuation means. This vacuum pump 21' is a means by which any gases left as impurities such as air are driven off before film formation, and is so constructed that its gate valve 33 is kept closed during the film formation.

Figure 3:
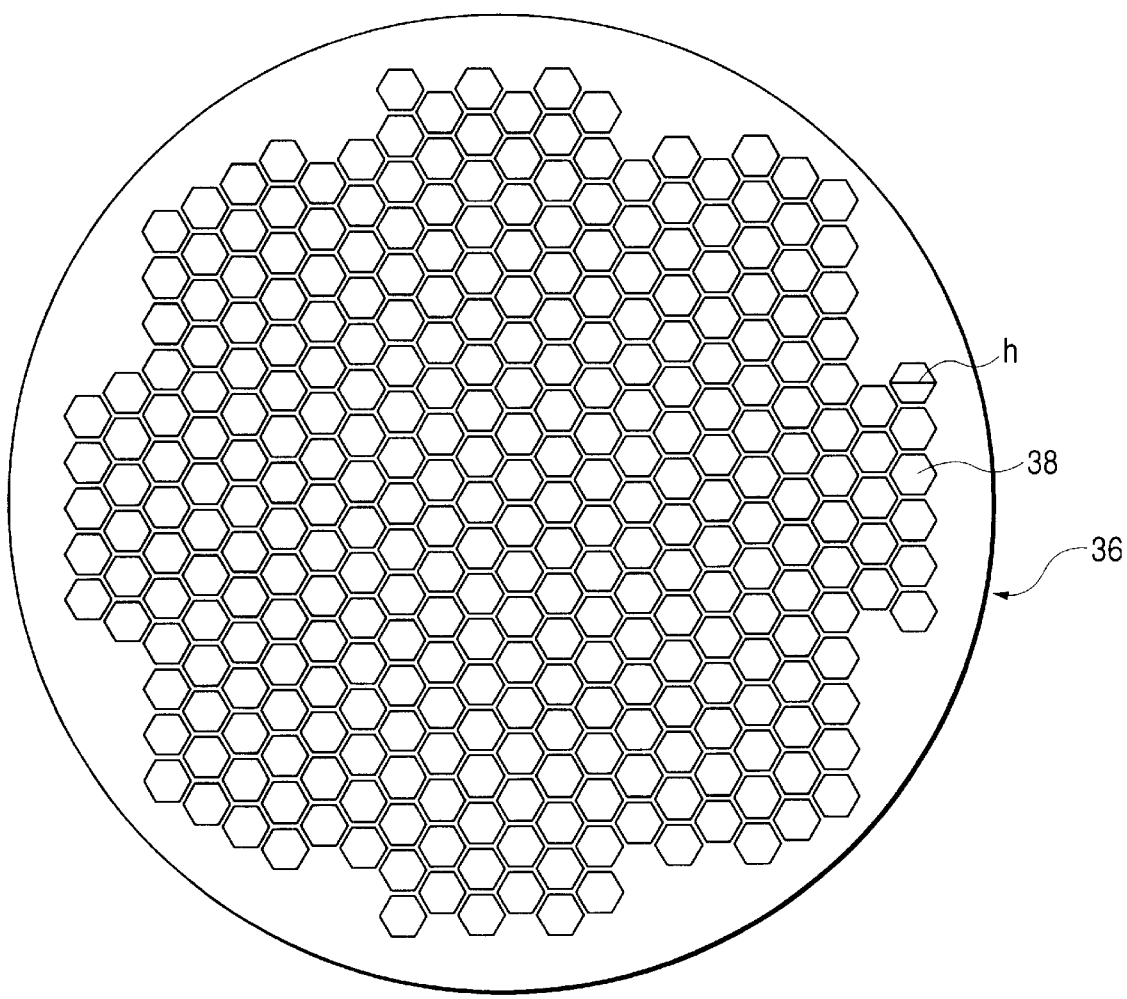
FIG. 3 is a schematic view showing an example of a grid plate used in the present invention.

FIG. 3 shows an example of the grid plate 36 used in the present invention. In this example, the grid plate 36 is so shaped that about 250 openings 38 in the form of hexagonal prisms each having a diagonal line h of 5 mm in length are made in a stainless-steel disk of 13 cm in diameter and 10 mm in thickness. Making each opening have a hexagonal cross section enables the openings to be densely arranged over the grid plate at a high degree. For example, where argon gas is flowed, the openings each has a conductance of 0.6 liter/second, and the whole grid has a conductance of 150 liter/second. Incidentally, the openings may have any other polygonal cross sections such as trigonal, tetragonal or pentagonal, or may have circular or oblique cross sections.

Thin-film formation making use of this thin-film formation system is carried out in the following way. The target 23 is fastened (fixed) to a cathode for magnetron sputtering via the backing plate 24. Also, the substrate 28 is provided on the substrate holder 28'. The vacuum pumps 21 and 21' are operated to evacuate the inside of the vacuum chamber 22. Thereafter, the gate valve 33 is closed and the vacuum chamber is continued being operated, in the state of which sputtering gas such as argon gas (Ar) is introduced into the vacuum chamber 22 via the flow controller 29.

The pressure in the sputtering space 34 and the pressure in the film-forming space 35 are each maintained at a stated pressure, where DC voltage is applied from the power source 26 to cause glow discharge of sputtering gas to take place. Here, the pressure in the film-forming space 35 is so controlled that the sputtered particles move with their mean free path which is longer than the distance between the grid plate 36 and the substrate 28. Positive argon ions generated by the glow discharge in front of the target 23 enter (bombard) the target, whereupon the target surface is sputtered. Part of target-constituent particles thus broken away (i.e., sputtered particles) passes through the openings 38 of the grid plate 36, and travels the film-forming space 35 to reach the surface of the substrate 28 and become deposited thereon into a film.

Figure 4:
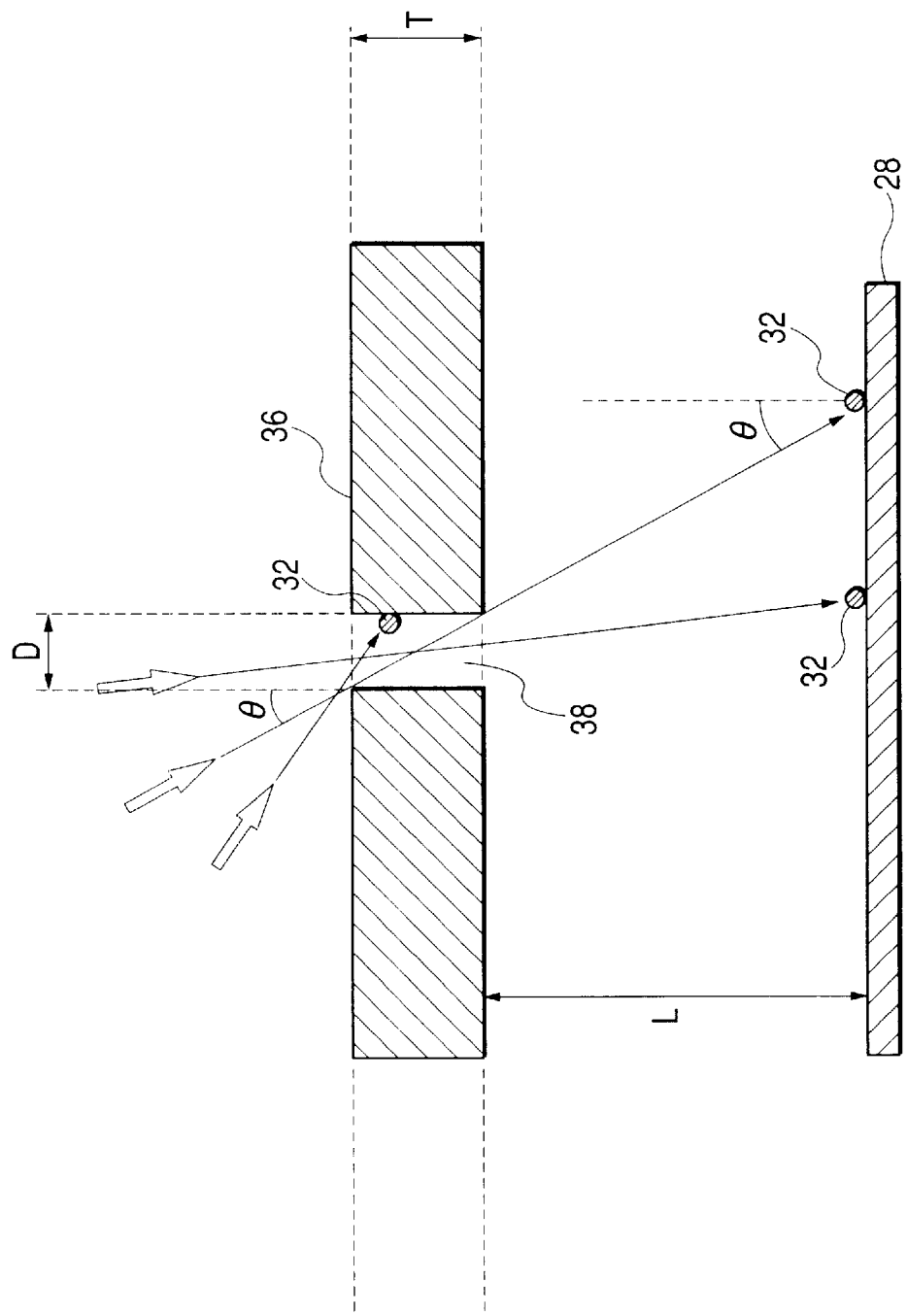
FIG. 4 illustrates a cross section of an opening of the grid plate and how sputtered particles passing therethrough stand.

FIG. 4 illustrates a cross section of an opening 38 of the grid plate 36 and how sputtered particles 32 passing therethrough stand. The sputtered particles 32 which enter the opening 38 of the grid plate 36 from the sputtering space 34 have velocities in various directions. However, as can be seen from FIG. 4, sputtered particles 32 passing through the opening 38 without colliding against the grid plate 36 are only those having incident angles not larger than the passing critical angle $\theta$, expressed by $\theta=\tan^{-1}(D/T)$, and those having incident angles larger than that collide against the grid plate 36 to become captured there, and can not pass through the grid plate 36. Here, D is the maximum value of diameter of the opening 38, T is the depth of the opening 38 (here, the same as the thickness of the grid plate), and T/D is called the aspect ratio.

For example, where a grid plate 36 having openings 38 with an aspect ratio of 10 mm/5 mm=2 is used, only sputtered particles having entered the grid plate 36 at an angle smaller than $\theta=27°$ can pass through the grid plate 36.

For example, where a pump having an evacuation volume of 2,000 liter/second based on argon is used as the vacuum pump 21, since both the sputtering space 34 and the film-forming space 35 are vacuumized using only this vacuum pump 21 in the course of film formation, argon gas is fed to the sputtering space 34 through the flow controller 29 at a flow rate of 33 sccm in order to cause glow discharge to take place. In such a case, because of the relationship between the conductance of the grid plate 36 and the evacuation volume of the vacuum pump 21, the pressure in the sputtering space 34 and that in the film-forming space 35 come to 0.4 Pa and 0.028 Pa, respectively. Thus, differential pressures can be provided which differ by one figure or more.

Here, the mean free path of sputtered particles in the sputtering space is 1.8 cm and the mean free path of sputtered particles in the film-forming space is 26 cm. Assuming that the distance L1 between the grid plate 36 and the target 23 is set to be 2 cm, and the distance L2 between the grid plate 36 and the substrate 28, 4 cm, the sputtered particles 32 collide against the sputtering gas (argon molecules 31; see FIG. 2) about 1.1 times in the sputtering space 34 and about 0.15 time in the film-forming space 35 until they reach the substrate 28. Hence, the sputtered particles 32 having been able to pass through the grid plate 36 because of their incident angles smaller than 27° are little scattered in the film-forming space 35 by the sputtering gas (argon molecules 31), and can reach the substrate 28 while keeping the distribution of their incident angles.

(Embodiment 2)

Figure 5:
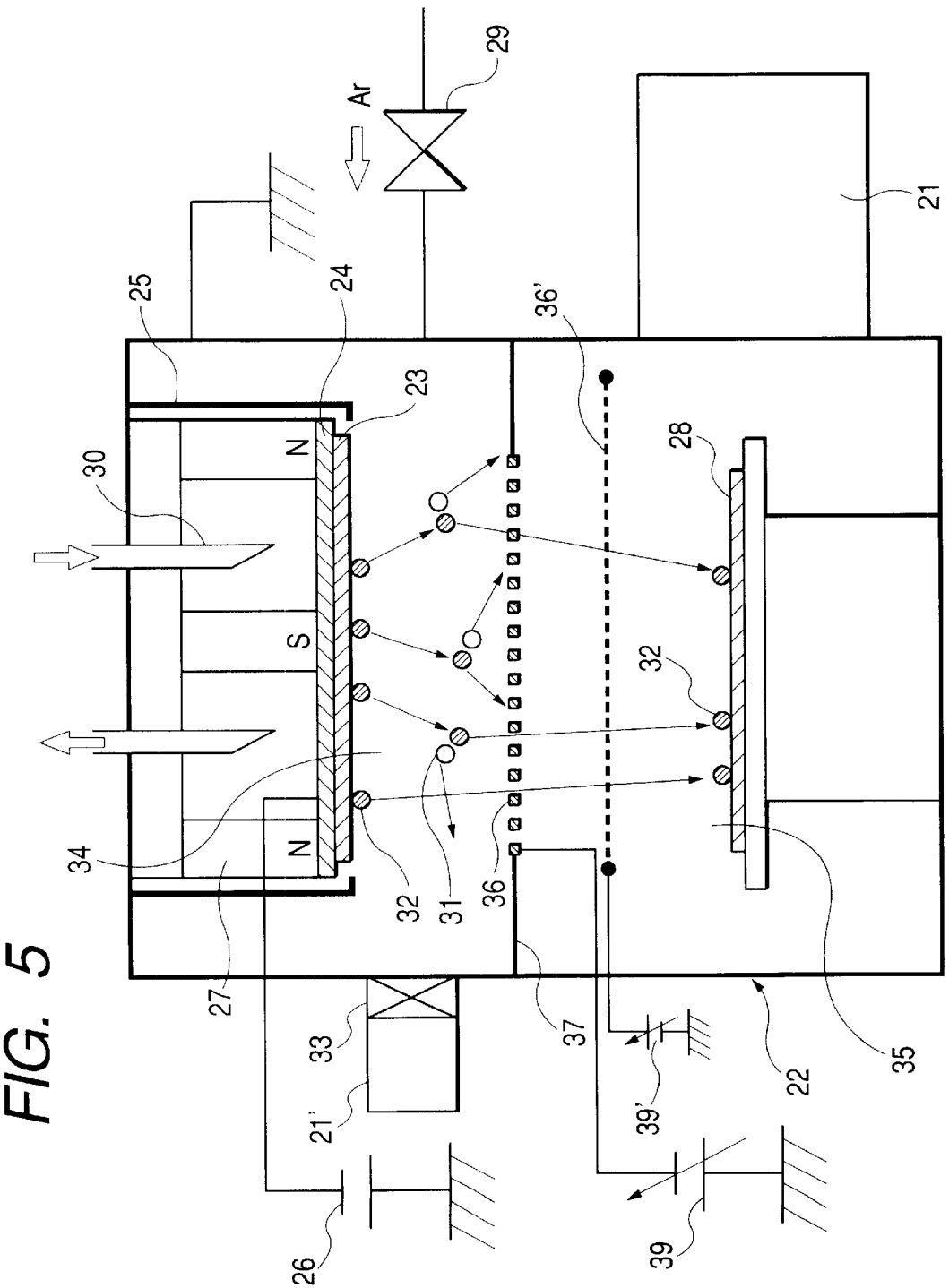
FIG. 5 is a schematic view showing a second embodiment of the thin-film formation system according to the present invention.

FIG. 5 is a schematic view showing a second embodiment of the thin-film formation system according to the present invention. In this embodiment, in addition to the construction of Embodiment 1 described above, a variable-voltage DC (direct current) power source 39 which can vary the polarity and voltage value of applied voltage is connected to the grid plate. In FIG. 5, the same members as those in FIG. 2 are denoted by like reference numerals to avoid repeating individual detailed description thereon. A component part denoted by reference numeral 36' is a network electrode provided optionally between the grid plate 36 and the substrate 28. A stated voltage is applied to the network electrode 36' from a variable-voltage power source 39' serving as a voltage application means, which is so applied that the potential of this network electrode may differ from the potential of plasma.

In conventional sputtering, the plasma is formed in front of the substrate 28, and hence any ions or electrons having a high energy can not be prevented from falling on the substrate 28, so that the characteristics of films formed are affected by such high-energy charged particles. As shown in FIG. 5, the variable-voltage DC power source 39 is connected to the grid plate 36, and the potential of the sputtering space 34 with respect to the chamber wall is set to any desired value, whereby charged particles falling on the substrate 28 can be controlled. Usually, plasma stands at a potential which is higher by +20 to +30 V with respect to the chamber wall. Accordingly, a positive voltage may be applied to the grid plate 36 so that the grid plate 36 can have a potential higher than the plasma potential, whereby positive argon particles of plasma can be prevented from entering the film-forming space 35 to reach the substrate 28. Conversely, a stated voltage (e.g., negative voltage) may be applied to the grid plate 36 so that the grid plate 36 can have a potential lower than the plasma potential, whereby the negative ions (e.g., electrons) can be prevented from entering the film-forming space 35.

As another means for preventing the positive argon ions of plasma from falling on the substrate 28, the network electrode 36' may be provided between the grid plate 36 and the substrate 28 as shown in FIG. 5, which electrode has been set to a potential higher than the plasma potential and whose change in conductance is at a negligible level. This enables the plasma potential to be less affected and can bring about more preferable effects. Also, a suitable bias voltage may be applied to the substrate 28 so that the substrate 28 can have a potential higher than the plasma potential.

For example, the thin-film formation system of the present embodiment may preferably be used when films of materials that can assume a plurality of crystal structures, such as tantalum, are formed. Upon vigorous bombardment on a film by charged particles, not β-Ta (cubic system) but α-Ta (body-centered cubic system) tends to be formed. Accordingly, the bias voltage applied to the grid plate or the bias voltage applied to the substrate may be controlled so that the above tendency can be utilized to form a tantalum film having the desired crystal structure.

(Embodiment 3)

Where the vacuum pump 21 attached to the film-forming space 35 has a small evacuation volume in Embodiments 1 and 2 described above, the use of the grid plate 36 shown in FIG. 3 may make the ratio of evacuation volume to grid plate conductance too small to provide any sufficient differential pressure. In such a case, the percentage of openings in the grid plate must be reduced to lower the conductance of the whole grid plate.

Figure 6:
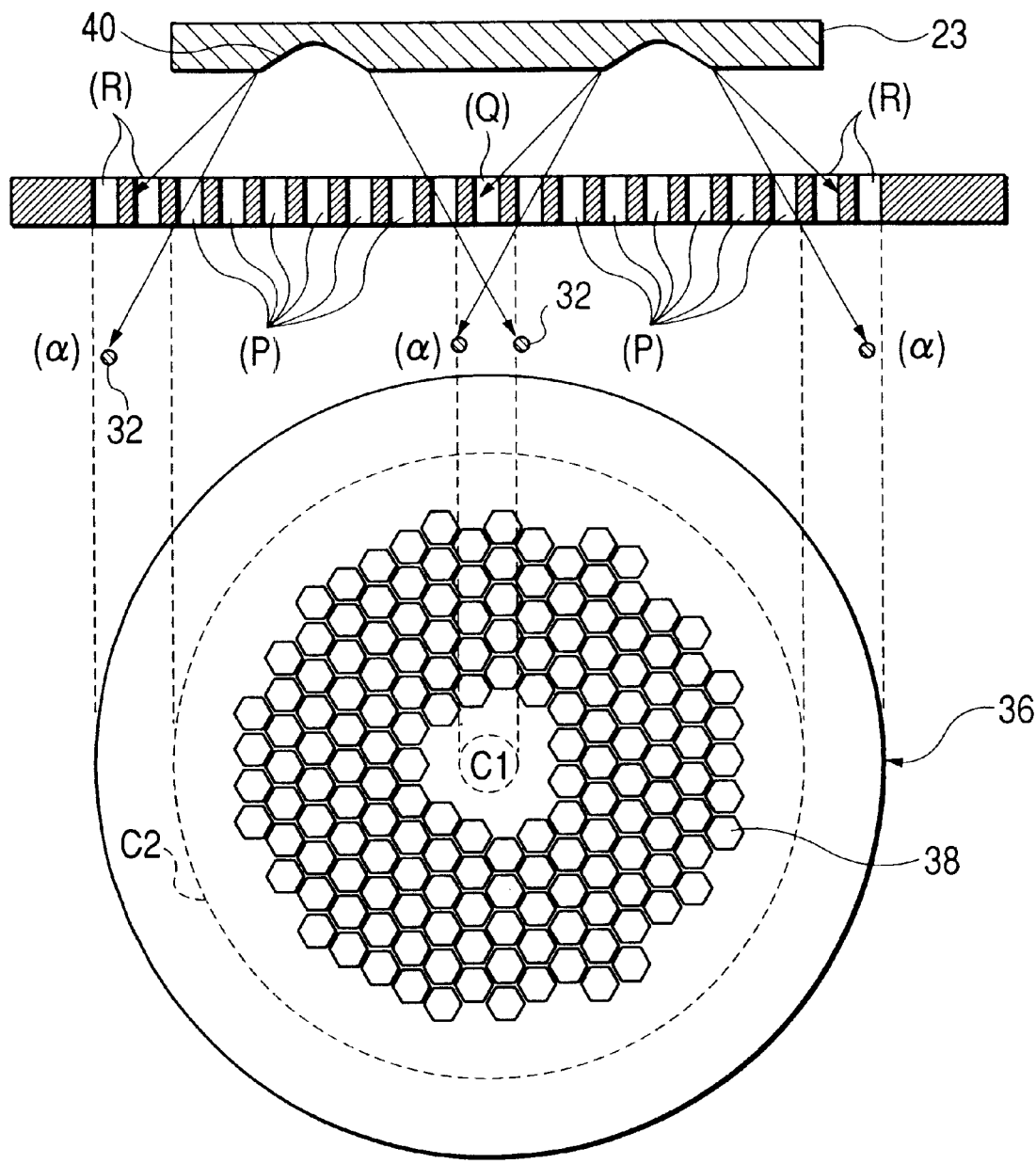
FIG. 6 is a diagrammatic view showing the positional relationship between openings of a grid plate and an erosion area of a target in a case in which a vacuum pump attached to a film-forming chamber shown in FIG. 2 has an evacuation volume of 500 liter/second.

FIG. 6 diagrammatically illustrates the positional relationship between the openings 38 of the grid plate 36 and an erosion area of the target 23 in a case in which the vacuum pump 21 attached to the film-forming space 35 shown in FIG. 2 has an evacuation volume of 500 liter/second. In the case of this evacuation volume, the grid plate 36 must have a conductance of 38 liter/second in order to provide the same differential pressure as in Embodiment 1. Accordingly, the number of openings 38 is reduced to about 65 (about 250 in Embodiment 1). Since the number of openings is limited, the openings 38 must be so arranged over the grid plate 36 that the sputtered particles can pass through it and films can be formed at a high rate.

If the scattering of sputtered particles by the sputtering gas (argon molecules 31) in the sputtering space 34 may be disregarded, as shown in FIG. 6 the sputtered particles 32 released from an erosion area 40 of the target pass through openings (P) of the grid plate 36, drawing straight-line loci of paths (a). However, openings (Q) and openings (R) can not allow to pass the sputtered particles which come flying from the erosion area 40. Accordingly, the openings of the grid plate 36 must be arranged on the outside of a circle C1 drawn by a dotted line in FIG. 6 and on the inside of a circle C2. In other words, only such openings that the erosion area 40 can be seen through openings of the grid plate 36 from the side of the film-forming space 35 can allow the sputtered particles 32 to pass, and hence the openings are provided only in such a region.

In the example shown in FIG. 6, the target 23 has a circular shape of 110 mm in diameter. Its erosion area 40 is in the region extending between a circumference of 2 cm in radius around the target center and a circumference of 4 cm in radius around that center, and is in the shape of a doughnut (ring-shaped). Then, since the aspect ratio of the openings is 2 and the distance L1 between the grid plate 36 and the target 23 is 2 cm as stated in Embodiment 1, the circle C1 is a circle having a radius of 0.5 cm and the circle C2 is a circle having a radius of 5.5 cm. All openings are made within this ring-shaped region held between these circles C1 and C2. As can be seen from FIG. 6, the erosion area 40 can be seen through the openings 38 within this region from the film-forming space side.

In the sputtering space 34, the sputtering is at a high pressure and hence the scattering of sputtered particles occurs. Since, however, the sputtered particles are scattered only about one time on the average until they reach the grid plate 36, no problem may come about in practical use even when the region within which the openings are arranged over the grid plate is determined on the assumption that the sputtered particles are not scattered.

(Embodiment 4)

Figure 7:
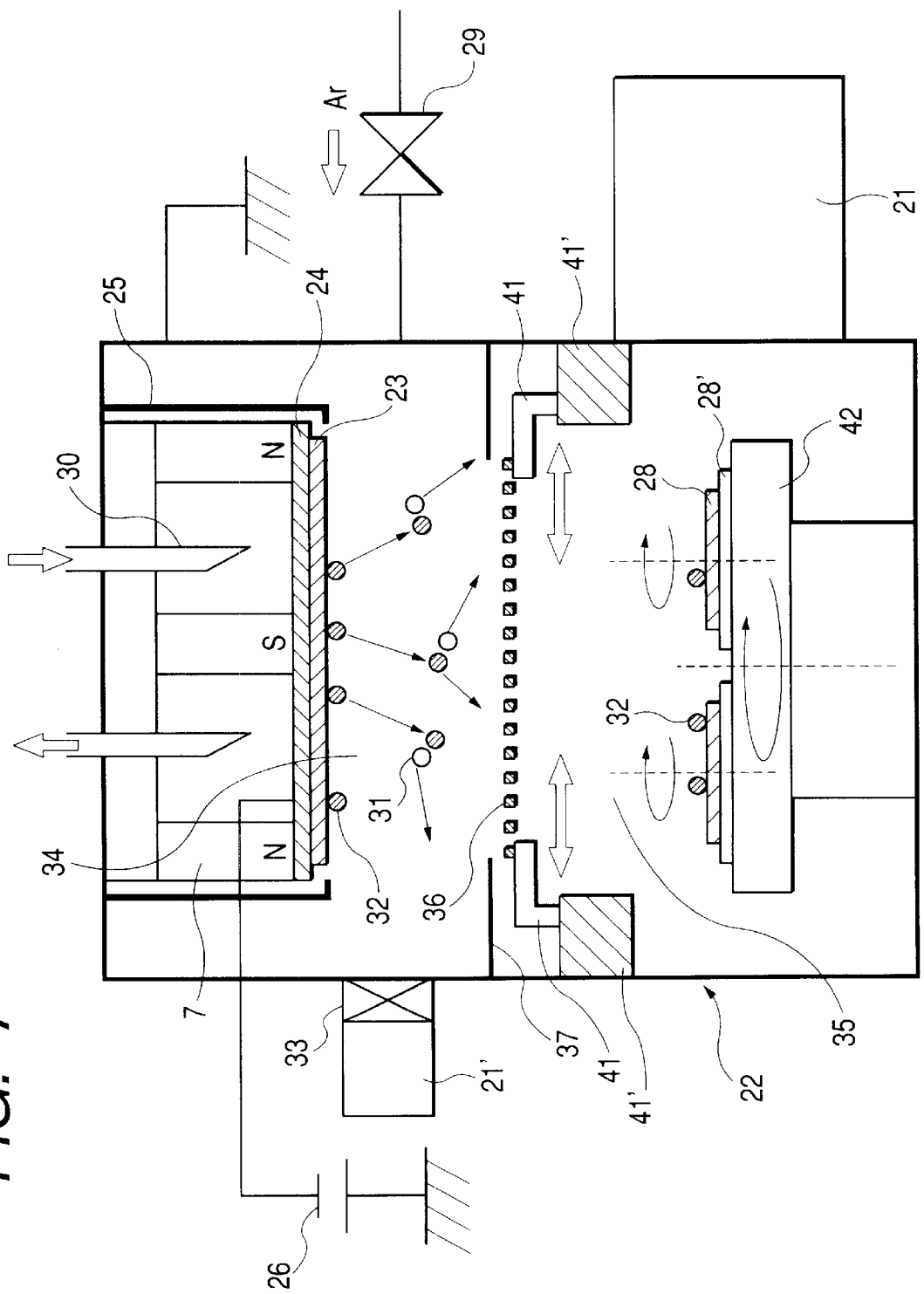
FIG. 7 is a schematic view showing a fourth embodiment of the thin-film formation system according to the present invention.

FIG. 7 is a schematic view showing a fourth embodiment of the thin-film formation system according to the present invention. The present Embodiment is one in which a mechanism for improving the uniformity of film thickness is provided in any of the embodiments described above. In FIG. 7, the same members as those in FIGS. 2 to 6 are denoted by like reference numerals to avoid repeating individual detailed description thereon. In reference to FIG. 7, the grid plate 36 is set apart from the partition wall 37, and is supported with a fixing jig 41 having a vibrating mechanism 41' which vibrates the grid plate right and left as viewed in the drawing (in the direction parallel to the target 23). Part of the grid plate 36 does not allow the sputtered particles to pass. Hence, if films are formed in the state the grid plate 36 and the substrate 28 are kept fixed, the film surface may have an unevenness after the shape of the openings 38. This unevenness of film surface can be prevented by vibrating the grid plate 36 right and left to shift the position of the openings 38 with respect to the substrate 28.

A mechanism for moving (turning) the substrate at the time of film formation may further optionally be attached to each of the substrate holder 28' for fixing the substrate 28 and the holder-fixing part 42 so that the film thickness can be made more uniform.

(Embodiment 5)

Figure 8:
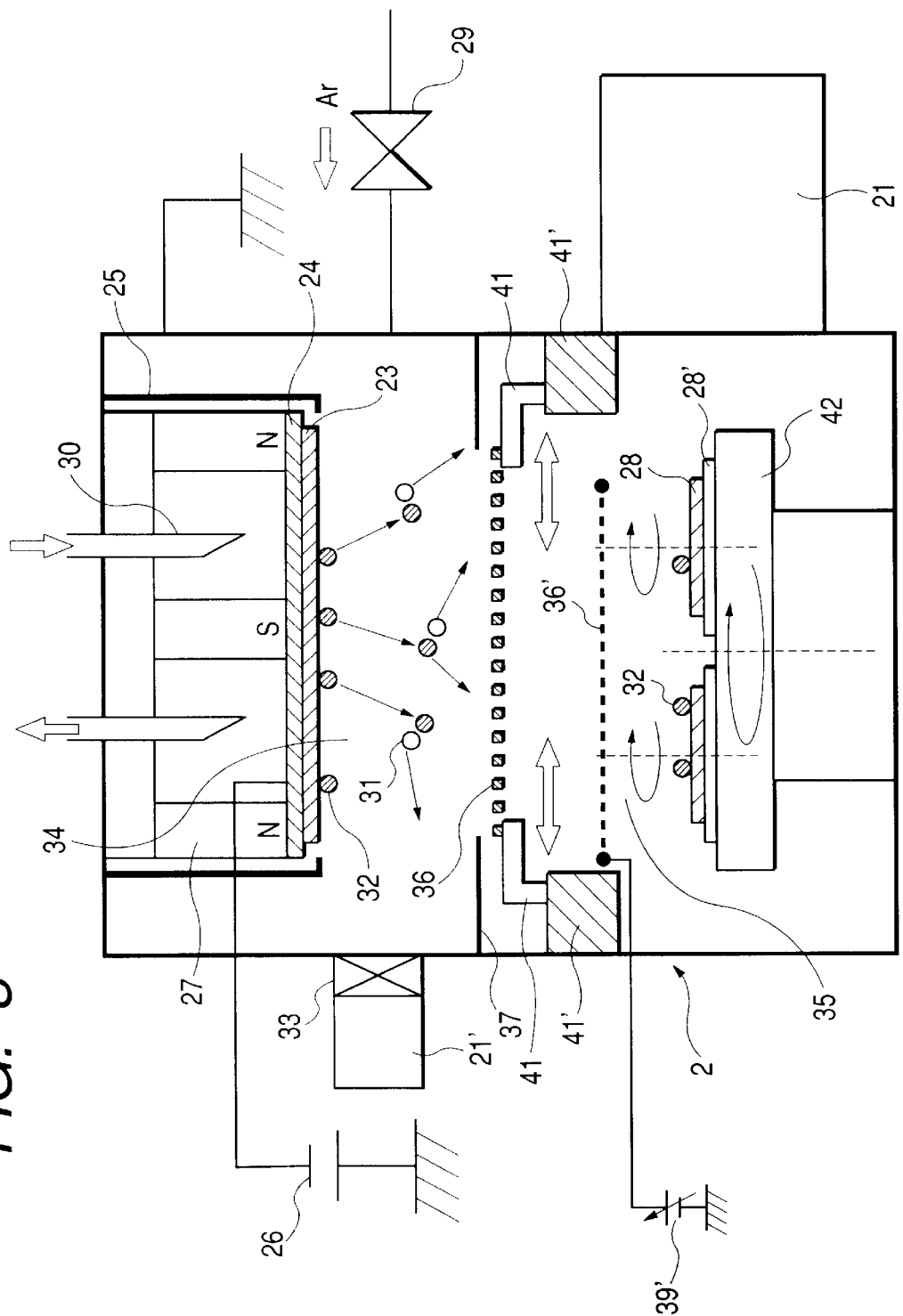
FIG. 8 is a schematic view showing a fifth embodiment of the thin-film formation system according to the present invention.

FIG. 8 is a schematic view showing a fifth embodiment of the thin-film formation system according to the present invention. In FIG. 8, the same members as those in FIGS. 2 to 7 are denoted by like reference numerals to avoid repeating individual detailed description thereon. In reference to FIG. 8, like Embodiment 4, the grid plate 36 is set apart from the partition wall 37 and is supported with a fixing jig 41 having a vibrating mechanism 41' which vibrates the grid plate right and left as viewed in the drawing (in the direction parallel to the target 23).

As shown in FIG. 8, a mechanism for rotating and revolving the substrate at the time of film formation may also optionally be attached to each of the substrate holder 28' for fixing the substrate 28 and the holder-fixing part 42 so that the film thickness can be made more uniform.

Like Embodiment 2, a network electrode 36' may further be provided between the grid plate 36 and the substrate 28. A stated voltage is applied to the network electrode 36' from a variable-voltage power source 39', which is so applied that the potential of this network electrode may differ from the potential of plasma, to keep (, or encourage) the charged particles from falling (, or to fall) on the substrate.

(Embodiment 6)

Figure 9:
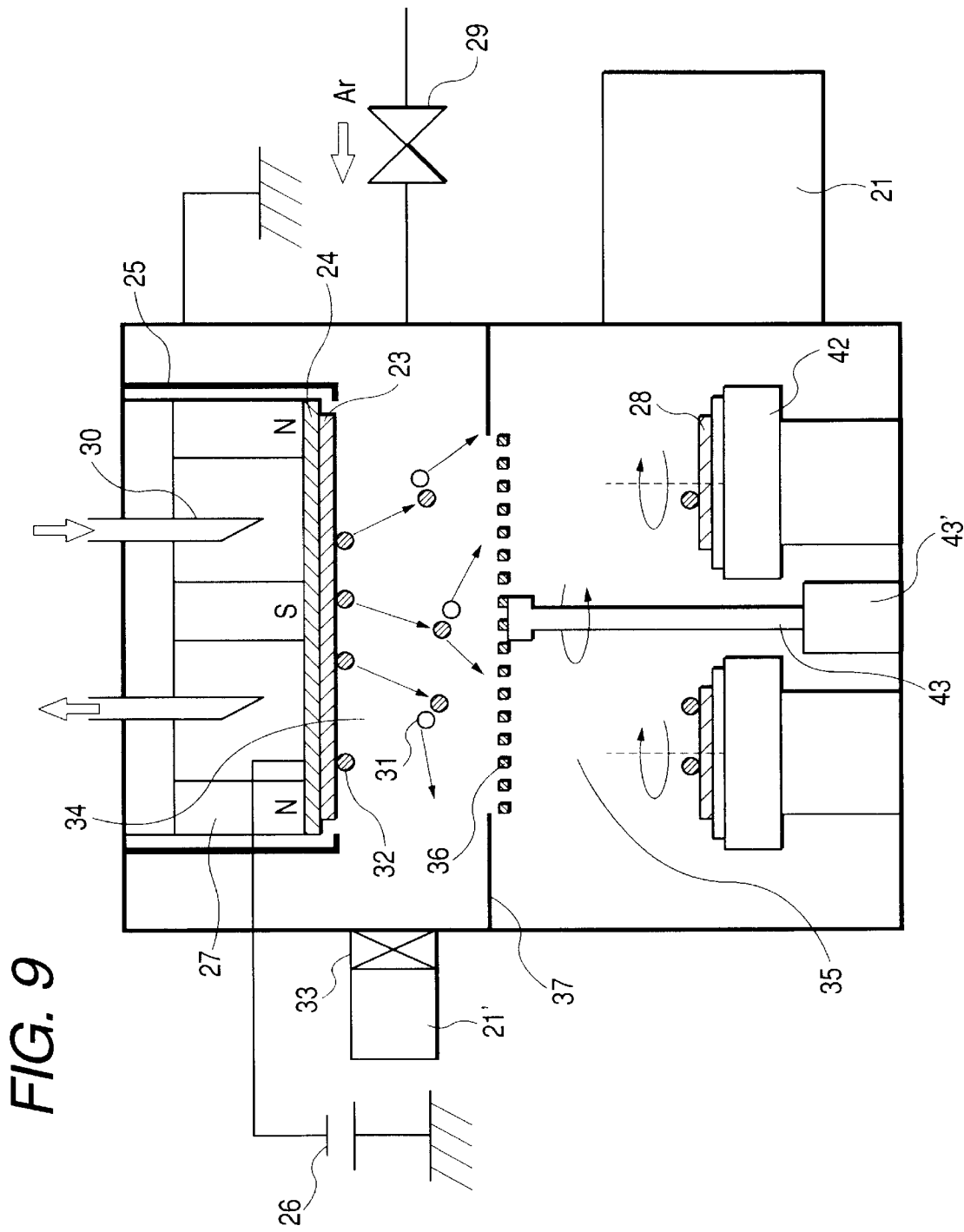
FIG. 9 is a schematic view showing a sixth embodiment of the thin-film formation system according to the present invention.

FIG. 9 is a schematic view showing a sixth embodiment of the thin-film formation system according to the present invention. In FIG. 9, the same members as those in FIGS. 2 to 8 are denoted by like reference numerals to avoid repeating individual detailed description thereon. In the systems shown in FIGS. 7 and 8, examples are shown in which the grid plate 36 is vibrated in parallel to the substrate 28 and target 23. In order to prevent the film from becoming uneven after the shape of the openings 38, the like effect is obtainable also when as shown in FIG. 9 the vibrating mechanism 41' is replaced with a fixing jig 43 having a rotating mechanism 43' which causes the grid plate 36 to turn around the center of the grid plate 36 as an axis. Usually, the shorter the distance between the grid plate 36 and the substrate 28 is, the more remarkably the film may become uneven because of the openings of the grid. Accordingly, the grid plate may be vibrated and/or turned so that the film can be prevented from becoming uneven because of the openings of the grid. This makes it possible to make much shorter the distance between the grid plate 36 and the substrate 28. In such a case, the sputtered particles can be made to less scatter in the film-forming space.

The vibration and/or rotation of the grid plate prevents the film from becoming uneven because of the installation of the grid plate 36, and is/are not able to correct the distribution of film thickness that may be caused even when no grid plate is provided. In the latter case, the distribution of film thickness can be made uniform where the mechanism described above that can move (turn) the substrate at the time of film formation is attached to each of the substrate holder 28' for fixing the substrate 28 and the holder-fixing part 42.

The present invention can be modified in variety besides the embodiments described above. The present invention embraces all such modifications as long as they do not deviate from the scope of claims.

What is claimed is:

1. A thin-film formation process for forming a thin film by means of a sputtering apparatus having a chamber comprising a sputtering space and a film-forming space and a grid plate disposed between the sputtering space and the film-forming space, comprising the steps of:

placing a target and a substrate in the sputtering space and the film-forming space, respectively;

maintaining the pressure in the film-forming space at a pressure lower than the pressure in the sputtering space and such that the following formula, $$3.1 \times 10^{-24} \times T/(\sigma^2 P) > L$$

is satisfied, where P (Pa) is the pressure of sputtering gas, σ (m) is the diameter of sputtered particles, T (K) is temperature of the film-forming space, and L is the distance between the grid plate and the substrate; and sputtering the target to form a thin film on the substrate.

2. The thin-film formation process according to claim 1, wherein the grid plate has openings each having an aspect ratio of 1 or higher.

3. The thin-film formation process according to claim 1, wherein, when the thin film is formed, a voltage is so applied to the grid plate that the potential of the grid plate differs from the potential of plasma generated in the sputtering space.

4. The thin-film formation process according to claim 1, wherein the sputtering apparatus has a network electrode between the grid plate and the substrate, and, when the thin film is formed, a voltage is so applied to the network electrode that the potential of the network electrode differs from the potential of plasma generated in the sputtering space.

5. The thin-film formation process according to claim 1, wherein, when the thin film is formed, a voltage is so applied to the substrate that the potential of the substrate is at a value higher than the potential of plasma generated in the sputtering space.

6. The thin-film formation process according to claim 1, wherein, when the thin film is formed, the grid plate is vibrated in parallel to the target.

7. The thin-film formation process according to claim 1, wherein, when the thin film is formed, the grid plate is rotated.

8. The thin-film formation process according to claim 1, wherein, when the thin film is formed, the substrate is moved in the chamber.

9. The thin-film formation process according to claim 1, wherein the grid plate has openings each having a cross-sectional shape of any of trigonal, tetragonal and hexagonal.

10. The thin-film formation process according to claim 1, wherein the grid plate has a plurality of openings which are so arranged as to be non-uniformly distributed over the grid plate.

11. The thin-film formation process according to claim 1, wherein the grid plate has a plurality of openings which are distributedly so arranged over the grid plate that an erosion area is seen when the target is looked at through the openings.

12. A thin-film formation system comprising:

a chamber comprising a sputtering space for placing a target therein and a film-forming space for placing therein a substrate on which a thin film is to be formed;

a grid plate disposed between the sputtering space and the film-forming space; and a pressure control means for maintaining the pressure in the film-forming space at a pressure lower than the pressure in the sputtering space and such that the following formula, $$3.1 \times 10^{-24} \times T/(\sigma^2 P) > L$$

is satisfied, where P (Pa) is the pressure of sputtering gas, σ (m) is the diameter of sputtered particles, T (K) is temperature of the film-forming space, and L is the distance between the grid plate and the substrate.

13. The thin-film formation system according to claim 12, wherein the grid plate has openings each having an aspect ratio of 1 or higher.

14. The thin-film formation system according to claim 12, which further comprises a power source for applying a voltage to the grid plate in such a way that the potential of the grid plate differs from the potential of plasma generated in the sputtering space.

15. The thin-film formation system according to claim 12, which further comprises a network electrode disposed between the grid plate and the substrate, and a power source for applying a voltage to the network electrode in such a way that the potential of the network electrode differs from the potential of plasma generated in the sputtering space.

16. The thin-film formation system according to claim 12, which further comprises a power source for applying a voltage to the substrate in such a way that the potential of the substrate is at a value higher than the potential of plasma generated in the sputtering space.

17. The thin-film formation system according to claim 12, which further comprises a drive means for vibrating the grid plate in parallel to the target.

18. The thin-film formation system according to claim 12, which further comprises a drive means for rotating the grid plate.

19. The thin-film formation system according to claim 12, which further comprises a drive means for moving the substrate in the chamber.

20. The thin-film formation system according to claim 12, wherein the grid plate has openings each having a cross-sectional shape of any of trigonal, tetragonal and hexagonal.

21. The thin-film formation system according to claim 12, wherein the grid plate has a plurality of openings which are so arranged as to be non-uniformly distributed over the grid plate.

22. The thin-film formation system according to claim 12, wherein the grid plate has a plurality of openings which are distributedly so arranged over the grid plate that an erosion area is seen when the target is looked at through the openings.

* * * * *